United States Patent [19]

Allman et al.

[11] Patent Number: 5,438,022

[45] Date of Patent: Aug. 1, 1995

[54] METHOD FOR USING LOW DIELECTRIC CONSTANT MATERIAL IN INTEGRATED CIRCUIT FABRICATION

[75] Inventors: Derryl D. J. Allman; Kenneth P. Fuchs; Gayle W. Miller; Samuel C. Gioia, all of Colorado Springs, Colo.

[73] Assignees: AT&T Global Information Solutions Company, Dayton, Ohio; Hyundai Electronics America, Milpitas, Calif.

[21] Appl. No.: 165,872

[22] Filed: Dec. 14, 1993

[51] Int. Cl.⁶ ............................................. H01L 21/00
[52] U.S. Cl. .................................. 437/231; 437/235; 437/238; 437/978
[58] Field of Search ................ 156/657, 656; 427/96; 437/225, 228, 231, 235, 238, 978

[56] References Cited

U.S. PATENT DOCUMENTS

| | | | |
|---|---|---|---|
| 3,676,756 | 7/1972 | Merrin | 317/235 |
| 4,039,702 | 8/1977 | DiBugnara et al. | 427/93 |
| 4,339,526 | 7/1982 | Baise et al. | 430/296 |
| 4,437,139 | 3/1984 | Howard | 361/313 |
| 4,654,223 | 3/1987 | Araps et al. | 427/12 |
| 4,656,050 | 4/1987 | Araps et al. | 427/12 |
| 4,719,125 | 1/1988 | Anello et al. | 437/231 |
| 4,810,673 | 3/1989 | Freeman | 437/239 |
| 4,859,253 | 8/1989 | Buchanan et al. | 148/33.3 |
| 4,965,134 | 10/1990 | Ahne et al. | 428/411.1 |
| 4,965,226 | 10/1990 | Gootzen et al. | 437/189 |
| 5,001,108 | 3/1991 | Taguchi | 357/71 X |
| 5,003,062 | 3/1991 | Yen | 437/231 |
| 5,043,789 | 8/1991 | Linde et al. | 357/52 |
| 5,051,377 | 9/1991 | Euen et al. | 437/24 |
| 5,114,754 | 5/1992 | Cronin et al. | 427/333 |
| 5,122,483 | 6/1992 | Sakai et al. | 437/238 |
| 5,206,091 | 4/1993 | Beuhler et al. | 428/446 |
| 5,254,497 | 10/1993 | Liu | 437/238 X |
| 5,290,399 | 3/1994 | Reinhardt | 156/655 |

Primary Examiner—Thi Dang
Attorney, Agent, or Firm—Wayne P. Bailey; Albert L. Sessler, Jr.

[57] ABSTRACT

A low dielectric material is applied, as by spinning on, over the passivation layer of a semiconductor chip to fill the gaps which may exist between the top layer metal lines, and thereby minimize the possibility of cross talk which might otherwise be present between those lines.

4 Claims, 3 Drawing Sheets

METHOD FOR USING LOW DIELECTRIC CONSTANT MATERIAL IN INTEGRATED CIRCUIT FABRICATION

BACKGROUND OF THE INVENTION

The present invention relates to a method for producing an integrated circuit device and more particularly relates to a method for producing an integrated circuit device in which circuit cross talk is minimized by using a low dielectric constant coating material.

Cross talk between top layer metal interconnect lines of a semiconductor device can be caused by a high dielectric constant material filling the space between two metal lines. The plastic material commonly used for packaging of integrated circuits normally has a dielectric constant of between 6 and 8. As moisture penetrates the plastic material, the dielectric constant of the material increases. A higher dielectric constant increases the likelihood of capacitive coupling between adjacent metal lines.

Cross talk and capacitive effects between metal lines in a semiconductor chip are becoming greater problems with shrinking geometries and increasing chip speeds. Many of the attendant problems are difficult to model and will inexplicably show up as errors.

SUMMARY OF THE INVENTION

In accordance with the present invention, a method for minimizing circuit cross talk between adjacent metal lines in an integrated circuit device is provided. This method employs the application of a low dielectric constant material over the passivation layer of an integrated circuit semiconductor device.

It is accordingly an object of the present invention to provide a method for minimizing cross talk between adjacent metal lines in an integrated circuit device.

It is another object of the present invention to provide a method for minimizing cross talk in an integrated circuit having a passivation layer by applying a low dielectric constant material over the passivation layer.

Another object is to provide a method for minimizing cross talk in an integrated circuit which includes the steps of applying a low dielectric constant material to the integrated circuit and curing the resulting structure by heating in a suitable atmosphere.

Additional benefits and advantages of the present invention will become apparent to those skilled in the art to which this invention relates from the subsequent description of the preferred embodiment and the appended claims, taken in conjunction with the accompanying drawings.

DETAILED DESCRIPTION

Figure 1:
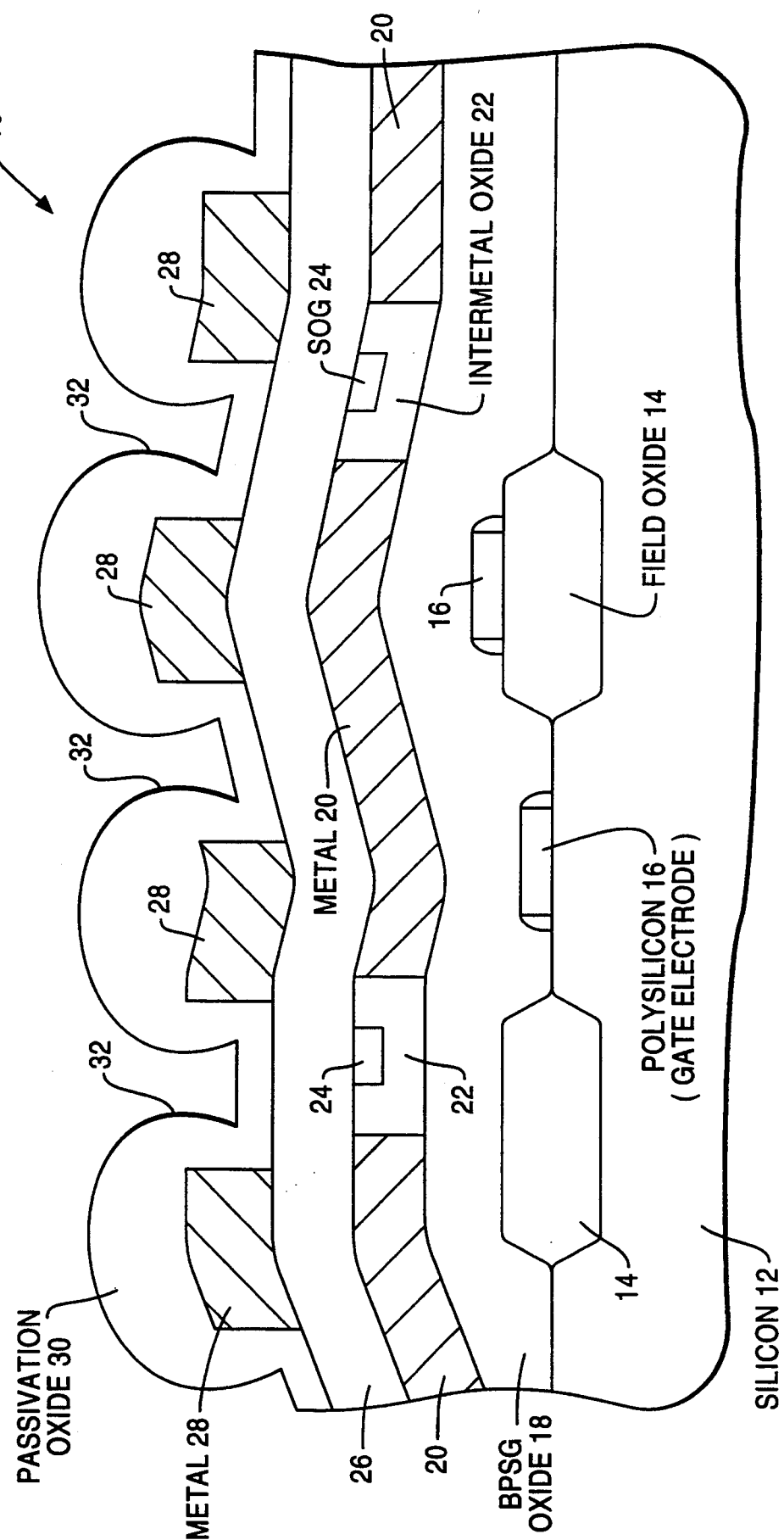
FIG. 1 is a sectional view of a typical integrated circuit wafer before a passivation SOG layer is applied thereto.

Referring now to FIG. 1, shown there is a cross-sectional view of a typical integrated circuit device 10, including a silicon substrate 12, field oxide elements 14 for isolation between transistors and polysilicon gates 16. A BPSG (boron phosphorus doped glass) oxide 18 extends over the substrate 12 and elements 14 and 16, while a first group of metal lines 20 are located over the BPSG oxide 18, and are separated by a first dielectric layer of intermetal oxide 22, having an SOG dielectric layer 24 positioned in the oxide layer 22. A second layer of intermetal oxide 26 is applied over the metal lines 20, the first oxide layer 22 and the SOG layer 24. Above the second layer of oxide 26 is a second group of metal lines 28 which may be disposed at right angles to the first lines 20. A passivation oxide 30 is deposited over the second group of metal lines 28. It will be seen that the passivation oxide 30 is not completely planar, but is formed, as a result of the deposition, with grooves or depressions 32 which extend downwardly between the metal lines 28.

Figure 2:
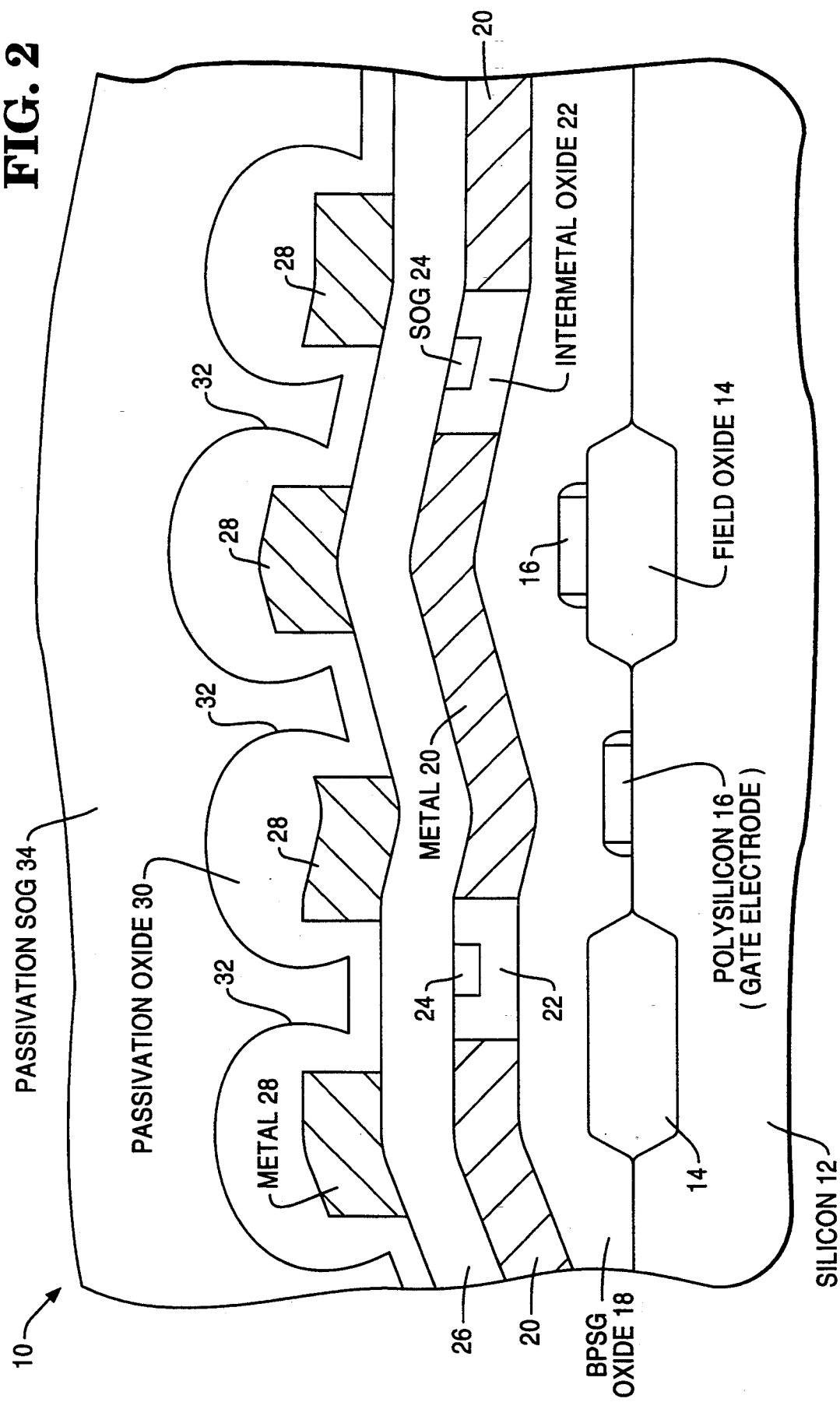
FIG. 2 is a sectional view similar to FIG. 1, but showing a passivation SOG layer applied thereto.

FIG. 2 shows the integrated circuit device 10 of FIG. 1 with a low dielectric constant passivation layer 34 added, in accordance with the present invention. It will be noted that the layer 34 fills the grooves 32 in the passivation oxide 30 between the metal lines 28, in addition to extending over the entire upper surface of the integrated circuit device 10. The plastic material which is normally used for packaging devices such as the integrated circuit device 10 is thus prevented from penetrating into the grooves 32 in the passivation oxide 30, where it might cause cross talk between adjacent metal lines 28.

Figure 3:
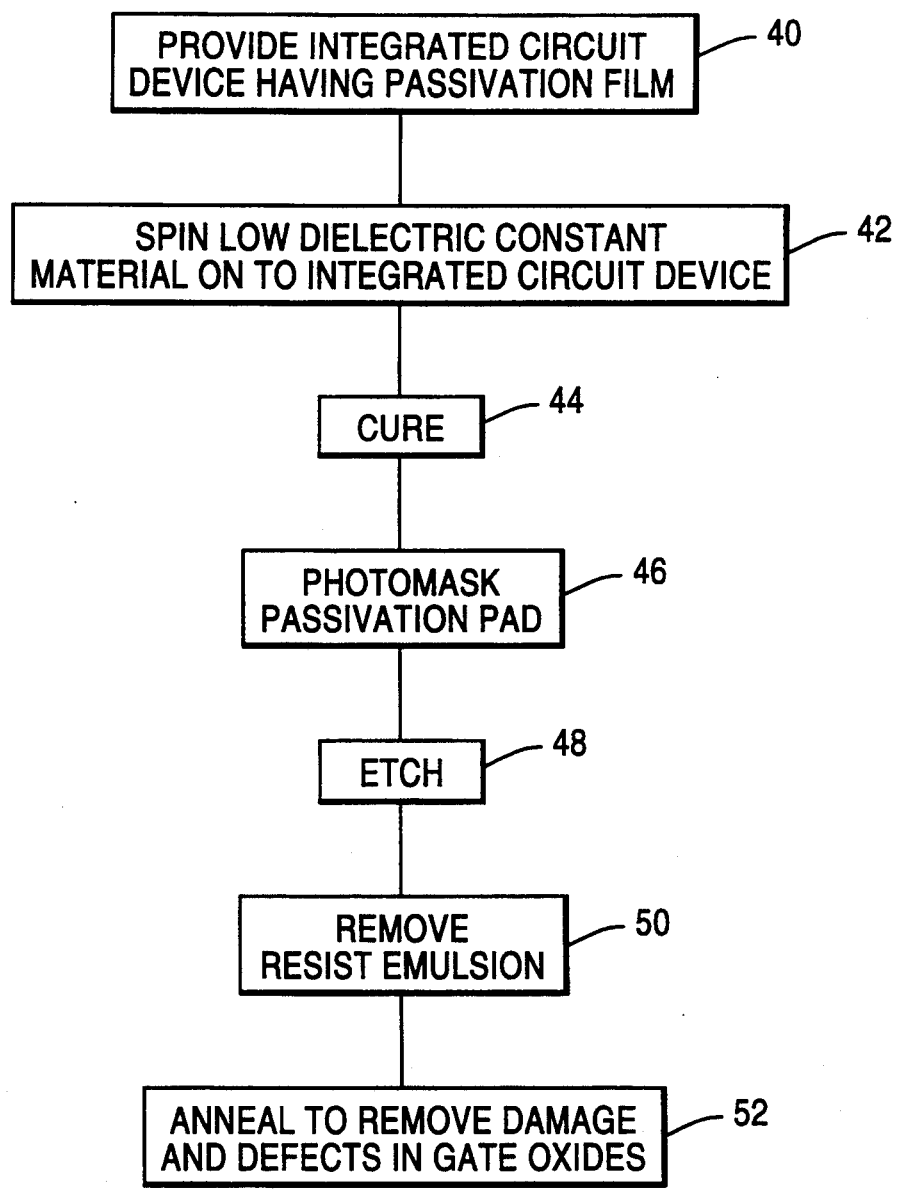
FIG. 3 is a flow diagram showing a process in which a passivation SOG layer is applied to an integrated circuit wafer.

The process for applying the passivation SOG layer 34 to the integrated circuit device 10 will now be described with reference to the flow diagram of FIG. 3. As shown in FIG. 3, and as represented by block 40, the process is initiated by the providing of an integrated circuit device, such as the device 10 of FIG. 1, on which a passivation film or oxide may have been applied.

Following this, and as represented in block 42, a low dielectric constant material 34 is spun or otherwise applied on top of the upper surface of the integrated circuit device 10, which surface may comprise the passivation oxide 30. As is well known, in the spin on glass (SOG) process, SOG is dispersed on a stationary wafer, and the wafer is then spun so that the SOG is distributed on the wafer by centrifugal force. The final thickness of the layer is based, at least in part, upon the spin rate.

The following materials are among those which have a low dielectric constant and can be spun on top of the passivation oxide 30: polyimide, spin-on-glass (SOG), glass resins of various compositions, and Teflon (Trademark). The range in dielectric constant for these materials is from 2 to 5. The dielectric constants of the SOGs, glass resins and Teflon materials do not appreciably increase with moisture incorporation. The thickness of the spun-on coating may vary from approximately one tenth micron to approximately twenty microns, depending on various considerations, such as the material being used.

Following the spinning on of material, the method includes a curing step, as represented by block 44. This curing can be accomplished in a furnace, or by other means, such as a bake oven or a hot plate oven. The temperature employed will normally vary from approximately 100 degrees Celsius to approximately 500 degrees Celsius, and the duration of the curing may vary widely, from a duration of approximately ten seconds to a duration of approximately seven hours. The curing process can take place in one of a number of different atmospheres, including air, oxygen, argon, nitrogen or forming gas, which comprises 10% hydrogen and 90% nitrogen. A typical curing operation may employ a temperature of 400 degrees Celsius for a duration of one hour in an atmosphere of nitrogen.

When the curing has been completed, photomasking and etching steps may be performed (blocks 46 and 48). This is done to open areas in the SOG layer and the passivation oxide layer to facilitate bonding from the package to the integrated circuit device.

Next, the resist emulsion from the steps represented by blocks 46 and 48 is removed, as represented by block 50. This step may not be necessary if the photoresist is completely consumed in the etching step.

Finally, as represented in block 52, the integrated circuit device 10 is annealed to remove any damage and defects which may be present in the gate oxides. It should be noted that this alloying or annealing step can be done prior to the application of the passivation oxide 30, or in some instances not at all.

The low dielectric constant coating material can also be used as a layer to relieve the stress which is imparted to the die or wafer by the application of the plastic thereto, if the layer exceeds one micron in thickness. If Teflon-based material is used, it may have to receive a special treatment after the final cure operation to enable the plastic encapsulating material to stick to the wafer. The Teflon surface may have to be roughened.

A relatively thick layer of the low dielectric constant material would also serve as a barrier to alpha particles which can cause errors in the integrated circuit device. For this, a layer in excess of five microns would be needed.

Although the invention has been described with particular reference to a preferred embodiment thereof, variations and modifications of the present invention can be effected within the spirit and scope of the following claims.

What is claimed is:

1. A method of producing an integrated circuit device in which cross talk between metal lines is reduced, comprising the following steps:
    (a) providing a integrated circuit device having a plurality of metal interconnect lines and a passivation layer disposed thereover;
    (b) applying a low dielectric constant material over said passivation layer, in which the low dielectric constant material comprises polyimide; and
    (c) applying a high dielectric constant material over said low dielectric constant material.

2. A method of producing an integrated circuit device in which cross talk between metal lines is reduced, comprising the following steps:
    (a) providing a integrated circuit device having a plurality of metal interconnect lines and a passivation layer disposed thereover;
    (b) applying a low dielectric constant material over said passivation layer, in which the low dielectric constant material comprises Teflon; and
    (c) applying a high dielectric constant material over said low dielectric constant material.

3. A method of reducing cross talk in an integrated circuit device having a plurality of metal interconnect lines and a passivation layer disposed thereover, comprising the steps of applying a low dielectric constant material over said passivation layer and applying a high dielectric constant material over said low dielectric constant material, in which the step of applying a low dielectric constant material comprises spinning said low dielectric constant material over said passivation layer, and in which said low dielectric constant material comprises polyimide.

4. A method of reducing cross talk in an integrated circuit device having a plurality of metal interconnect lines and a passivation layer disposed thereover, comprising the steps of applying a low dielectric constant material over said passivation layer and applying a high dielectric constant material over said low dielectric constant material, in which the step of applying a low dielectric constant material comprises spinning said low dielectric constant material over said passivation layer, and in which said low dielectric constant material comprises Teflon.

* * * * *